(12) United States Patent  
Chan et al.

(10) Patent No.: US 8,143,511 B2
(45) Date of Patent: Mar. 27, 2012

(54) TEXTURE PROCESS AND STRUCTURE FOR MANUFACTURE OF COMPOSITE PHOTOVOLTAIC DEVICE SUBSTRATES

(75) Inventors: Yick Chuen Chan, Wanchai (HK); Nathan W. Cheung, Wanchai (HK)

(73) Assignee: Silicon China (HK) Limited, Kowloon (HK)

( * ) Notice: Subject to any disclaimer, the term of this patent is extended or adjusted under 35 U.S.C. 154(b) by 0 days.

(21) Appl. No.: 12/182,663

(22) Filed: Jul. 30, 2008

(65) Prior Publication Data

US 2009/0071530 A1 Mar. 19, 2009

Related U.S. Application Data

(60) Provisional application No. 60/972,002, filed on Sep. 13, 2007.

(51) Int. Cl.
*H02N 6/00* (2006.01)
(52) U.S. Cl. ..................................... 136/249
(58) Field of Classification Search .............. 136/249; 228/123.1
See application file for complete search history.

(56) References Cited

U.S. PATENT DOCUMENTS

| | | | |
|---|---|---|---|
| 4,409,980 A | 10/1983 | Yano et al. | |
| 4,543,113 A | 9/1985 | Forester et al. | |
| 5,589,006 A * | 12/1996 | Itoyama et al. | 136/248 |
| 5,637,510 A * | 6/1997 | Morikawa et al. | 438/98 |
| 5,776,262 A * | 7/1998 | Melchior | 136/251 |
| 5,985,742 A * | 11/1999 | Henley et al. | 438/515 |
| 6,380,106 B1 | 4/2002 | Lim et al. | |
| 2003/0017712 A1* | 1/2003 | Brendel | 438/758 |
| 2005/0178428 A1* | 8/2005 | Laaly et al. | 136/251 |
| 2006/0024976 A1 | 2/2006 | Waldfried | |
| 2006/0170077 A1 | 8/2006 | Aoki et al. | |
| 2007/0123013 A1 | 5/2007 | Henley et al. | |
| 2007/0193621 A1 | 8/2007 | Brabec | |

OTHER PUBLICATIONS

Landis Geoffrey A., "A Light-Trapping Solar Cell Coverglass," IEEE Photovoltaic Specialists Conference, Kissimmee, FL, May 21-25, 1990, vol. 2, pp. 1304-1307.
International Search Report and Written Opinion of PCT Application No. PCT/US2008/072246, date of mailing Nov. 7, 2008, 12 pages total.

* cited by examiner

*Primary Examiner* — Basia Ridley
*Assistant Examiner* — Tamir Ayad
(74) *Attorney, Agent, or Firm* — Ella Cheong H K Ltd.; Margaret Burke; Sam Yip

(57) ABSTRACT

A composite structure, e.g., rigid or flexible. The structure has a layer transferred photovoltaic material (e.g., single crystal silicon) having a first region and a second region, and a thickness of material provided between the first region and the second region. The structure has a glue layer overlying the second region. A permeable membrane structure is overlying the glue layer, the permeable membrane structure configured to facilitate outgassing of any volatile species in the glue layer to allow the glue layer to bind the permeable membrane to the layer transferred photovoltaic material.

17 Claims, 18 Drawing Sheets

TEXTURE PROCESS AND STRUCTURE FOR MANUFACTURE OF COMPOSITE PHOTOVOLTAIC DEVICE SUBSTRATES

CROSS-REFERENCE TO RELATED APPLICATIONS

This application claims priority to U.S. Provisional Application No. 60/972,002 entitled "Texture Process and Structure for Manufacture of Composite Photovoltaic Device Substrates" filed Sep. 13, 2007, which is incorporated by reference herein for all purposes.

BACKGROUND OF THE INVENTION

The present invention relates generally to solar energy techniques. In particular, the present invention relates generally to solar energy techniques. In particular, the present invention provides a method and resulting device fabricated for solar cell structures with high efficiency and low material costs. More particularly, the present invention provides a method and resulting device for manufacturing solar cells with thin photovoltaic regions provided on a fabric. Merely by way of example, the invention has been applied to solar cells and solar panels, commonly termed modules, but it would be recognized that the invention has a much broader range of applicability.

Consumption of energy resources continues to grow, as the population of the world increases rapidly to over six billion people. Often times, conventional energy comes from fossil fuels, including oil and coal, hydroelectric plants, nuclear sources, and others. As merely an example, further increases in oil consumption have been projected. Developing nations such as China and India account for most of the increase, although the United States remains the biggest consumer of energy resources. In the U.S., almost every aspect of our daily lives depends, in part, on oil. These aspects include driving to and from work, heating our homes, and operating large machines for construction and the like.

Oil is becoming increasingly scarce. As time further progresses, an era of "cheap" and plentiful oil is coming to an end. Oil will eventually disappear, which could possibly take us back to primitive times. Accordingly, other and alternative sources of energy have been developed. Modern day society has also relied upon other very useful sources of energy. Such other sources of energy include hydroelectric, nuclear, and the like to provide our electricity needs. Such electricity needs range from lighting our buildings and homes to operating computer systems and other equipment and the like. Most of our conventional electricity requirements for these home and business use come from turbines run on coal or other forms of fossil fuel, nuclear power generation plants, and hydroelectric plants, as well as other forms of renewable energy. A popular form of renewable energy has been solar, which is derived from our sun.

The sun is essential for solar energy. Solar energy possesses many desired characteristics. As noted above, solar energy is renewable. Solar energy is also abundant and clean. Conventional technologies developed often capture solar energy, concentrate it, store it, and convert it into other useful forms of energy. A popular example of one of these technologies includes solar panels. Such solar panels include solar cells that are often made using silicon bearing materials, such as polysilicon or single crystal silicon. An example of such solar cells can be manufactured by various companies that span our globe. Such companies include, among others, Q Cells in Germany, Sun Power Corporation in California, Suntech of China, and Sharp in Japan. Other companies include BP Solar and others.

Unfortunately, solar cells still have limitations although solar panels have been used successfully for certain applications. As an example, solar cells are often costly. Solar cells are often composed of silicon bearing wafer materials, which are difficult to manufacture efficiently on a large scale. Availability of solar cells made of silicon is also somewhat scarce with limited silicon manufacturing capacities. These and other limitations are described throughout the present specification, and may be described in more detail below.

From the above, it is seen that techniques for improving solar devices is highly desirable.

BRIEF SUMMARY OF THE INVENTION

According to the present invention, techniques related to solar energy are provided. In particular, the present invention provides a method and resulting device fabricated for solar cell structures with high efficiency and low material costs. More particularly, the present invention provides a method and resulting device for manufacturing solar cells with thin photovoltaic regions provided on a fabric. Merely by way of example, the invention has been applied to solar cells and solar panels, commonly termed modules, but it would be recognized that the invention has a much broader range of applicability.

In a specific embodiment, the present invention provides a composite structure, e.g., rigid or flexible. The structure has a layer transferred photovoltaic material (e.g., single crystal silicon) having a first region and a second region, and a thickness of material provided between the first region and the second region. The structure has a glue layer overlying the second region. A permeable membrane structure is overlying the glue layer, the permeable membrane structure configured to facilitate outgassing of any volatile species in the glue layer to allow the glue layer to bind the permeable membrane to the layer transferred photovoltaic material.

In yet an alternative embodiment, the present invention provides a method for fabricating a composite structure. The method includes providing a substrate having a surface region and a cleave region within a vicinity of the substrate, which is configured for a layer transfer process by removing a thickness of material from a remaining substrate portion at the cleave region. The method includes forming a glue layer having a liquid base material overlying the surface region. In a preferred embodiment, the liquid material is capable of outgassing one or more volatile species, which may facilitate curing of the glue layer. The method includes coupling a permeable membrane structure to the glue layer. The method includes processing the permeable membrane structure coupled to the substrate to cause outgassing of a substantial portion of the volatile species from the glue layer through the permeable membrane structure and curing the glue layer to form a substantially rigid solid structure to firmly engage the substrate to the permeable member structure.

Many benefits are achieved by way of the present invention over conventional techniques. For example, the present technique provides an easy to use process that relies upon conventional technology such as silicon materials, although other materials can also be used. Additionally, the method provides a process that is compatible with conventional process technology without substantial modifications to conventional equipment and processes. Preferably, the invention provides for an improved solar cell, which is less costly and easy to handle. Such solar cell uses a hydrogen co-implant to form a thin layer of photovoltaic material. Since the layers are very thin, multiple layers of photovoltaic regions can be formed from a single conventional single crystal silicon or other like material wafer. In a preferred embodiment, the present thin layer removed by hydrogen implant and thermal treatment can be provided on a low grade substrate material, which will serve as a support member. In a preferred embodiment, the present method and structure can be provided on a permeable material and/or composite, which can facilitate curing of a glue layer, which is provided between a thickness of semiconductor material (which is substantially non-permeable) and the permeable material, e.g., textile, porous. In other embodiments one or more of these benefits and/or features may be achieved:

Low viscosity gap-filling glue (e.g. spin on glass) planarize rough (transferred or porous) silicon surface, enabling multiple layer transfers from a single Si wafer;

Use of liquid glue alleviates wafer warpage and dust particle trapping requirements;

Low temperature adhesive bonding reduces equipment cost and production time;

Rough handling materials enhance the adhesion to the transferred layer

Porous/gas permeable handling material allows bonding with degassing glues requiring high temperature curing;

Low cost handling material avoids expensive silicon materials; and

Use of after-process receptor layer/substrate (e.g. polymer, glass or spray-on materials) significantly reduce material cost.

These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques related to solar energy are provided. In particular, the present invention provides a method and resulting device fabricated for solar cell structures with high efficiency and low material costs. More particularly, the present invention provides a method and resulting device for manufacturing solar cells with thin photovoltaic regions provided on a fabric. Merely by way of example, the invention has been applied to solar cells and solar panels, commonly termed modules, but it would be recognized that the invention has a much broader range of applicability.

Figure 1:
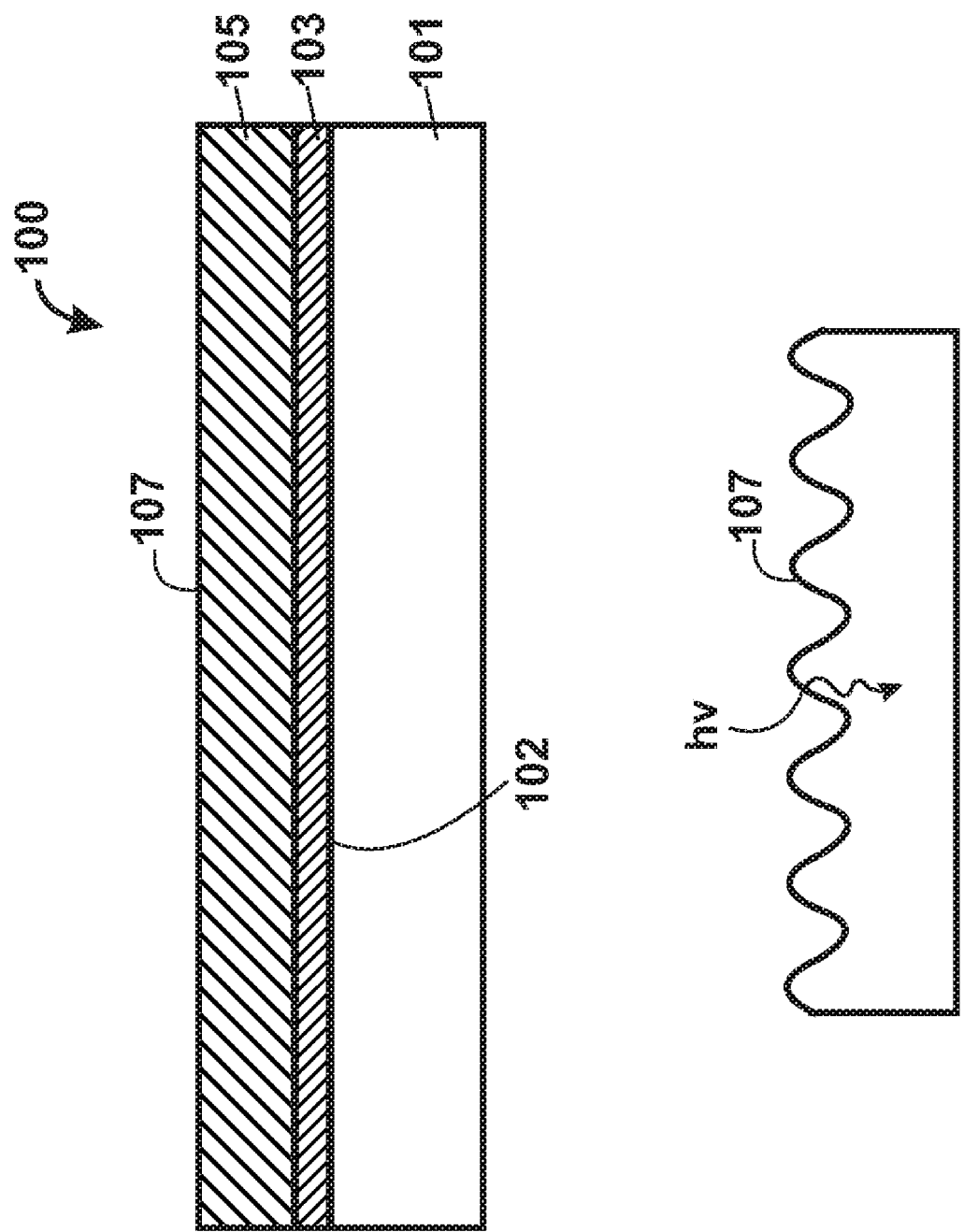
FIG. 1 is a simplified side-view diagram of a photovoltaic device according to an embodiment of the present invention.

FIG. 1 is a simplified side-view diagram of a photovoltaic device according to an embodiment of the present invention. This diagram is merely an example, which should not unduly limit the scope of the claims herein. One of ordinary skill in the art would recognize many variations, modifications, and alternatives. As shown is a based material for a photovoltaic device 100. The device has a support substrate 101 having a support surface 102 region. In a specific embodiment, the support substrate can be a metal, dielectric, or semiconductor, or any combination of these. The support substrate can also be a permeable organic polymer material, composite, or other structural entity according to a specific embodiment. As merely an example, the metal can be permeable or textile made of stainless steel, aluminum, molybdenum, titanium, or silicides, including oxides of these metals. As merely an example, the dielectric material can be a permeable or textile made of glass, quartz, organic polymer, or ceramics. As merely an example, the semiconductor can be permeable or textile made of silicon, including amorphous silicon, polysilicon, solar-grade silicon, and other forms of silicon. Of course, there can be other variations, modifications, and alternatives.

In a specific embodiment, the device has a thickness of crystalline material 105 characterized by a plurality of worm hole structures therein overlying the support surface region of the support substrate. In a specific embodiment, the crystalline material is a semiconductor material, which will serve as a base material for a photovoltaic device. As an example, the material can be single crystal silicon, silicon germanium, gallium arsenide, Group II/VI, or Group III/V materials. Alternatively, the material can be composites, layered, graded, or others, depending upon the specific embodiment. Of course, there can be other variations, modifications, and alternatives.

In a specific embodiment, the worm hole structures are characterized by a density distribution. In a specific embodiment, the pores per volume density is higher near surface region 107 than at interface region toward the surface region 102 of the support substrate. Of course, there can be variations, modifications, and alternatives.

Figure 1A:
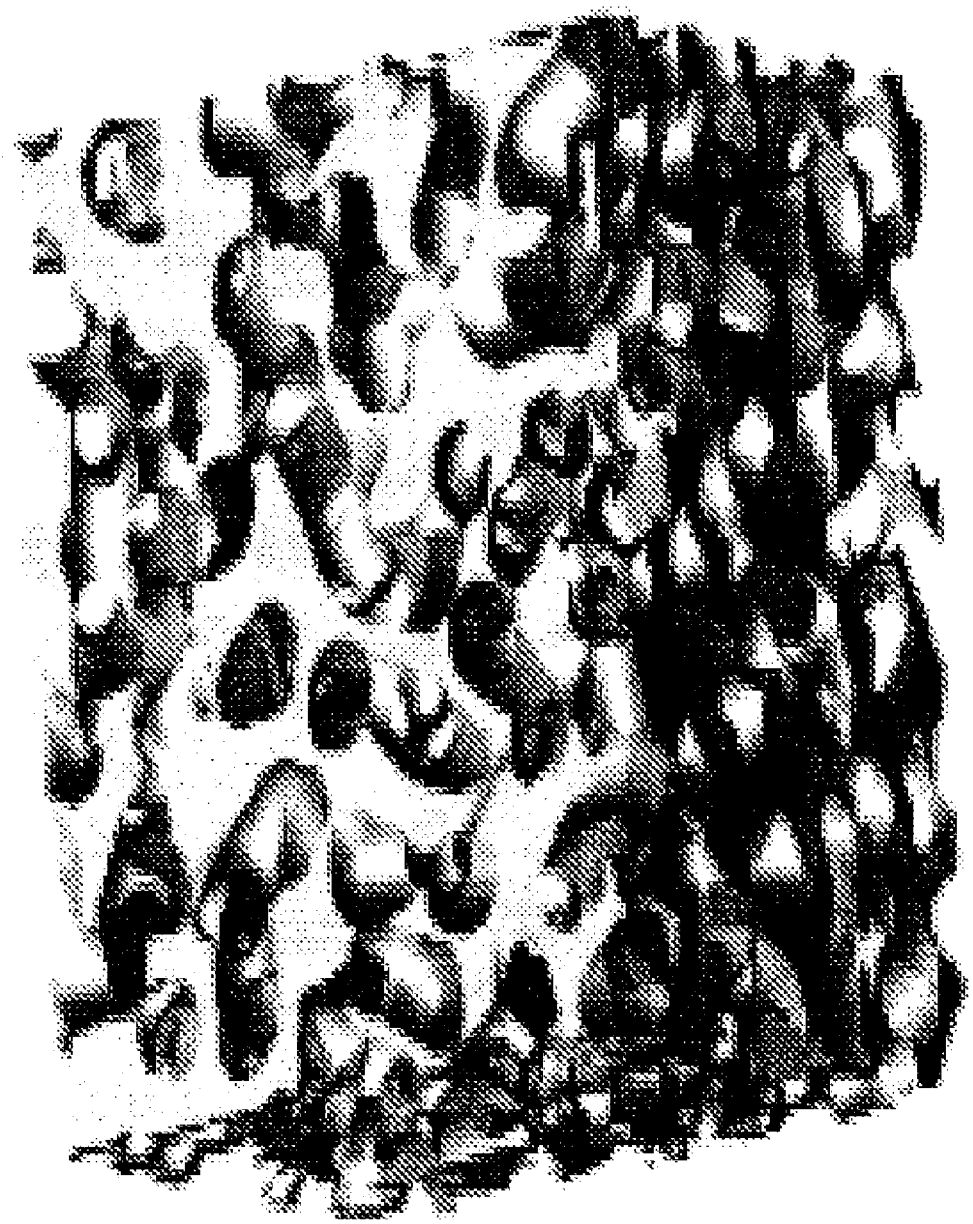
FIG. 1A is a detailed diagram of a crystalline material characterized by worm hole structures according to an embodiment of the present invention.
Figure 1B:
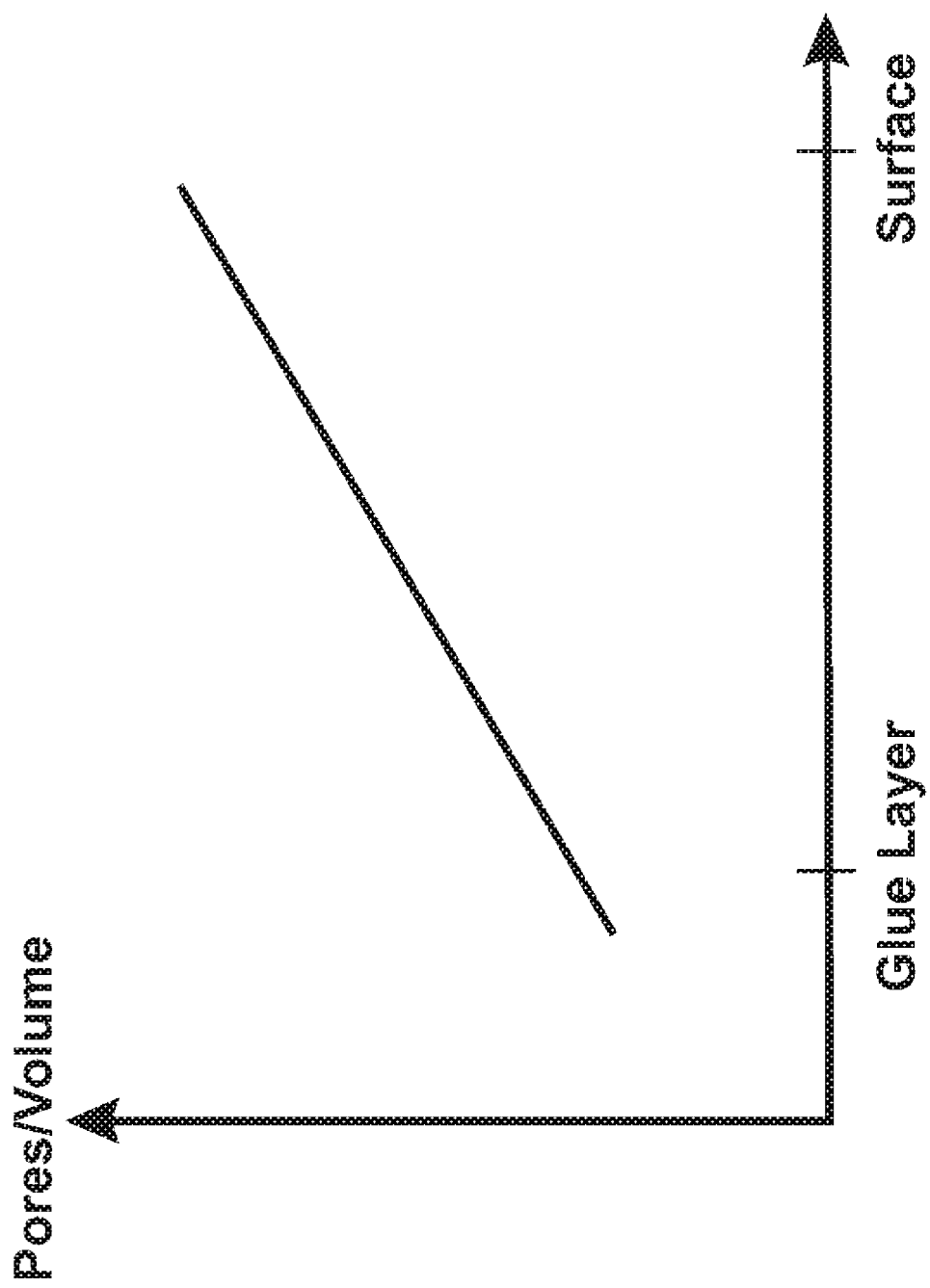
FIG. 1B is a simplified diagram of a plot illustrating pore density distribution of a thickness of crystalline material according to an embodiment of the present invention.
Figure 1C:
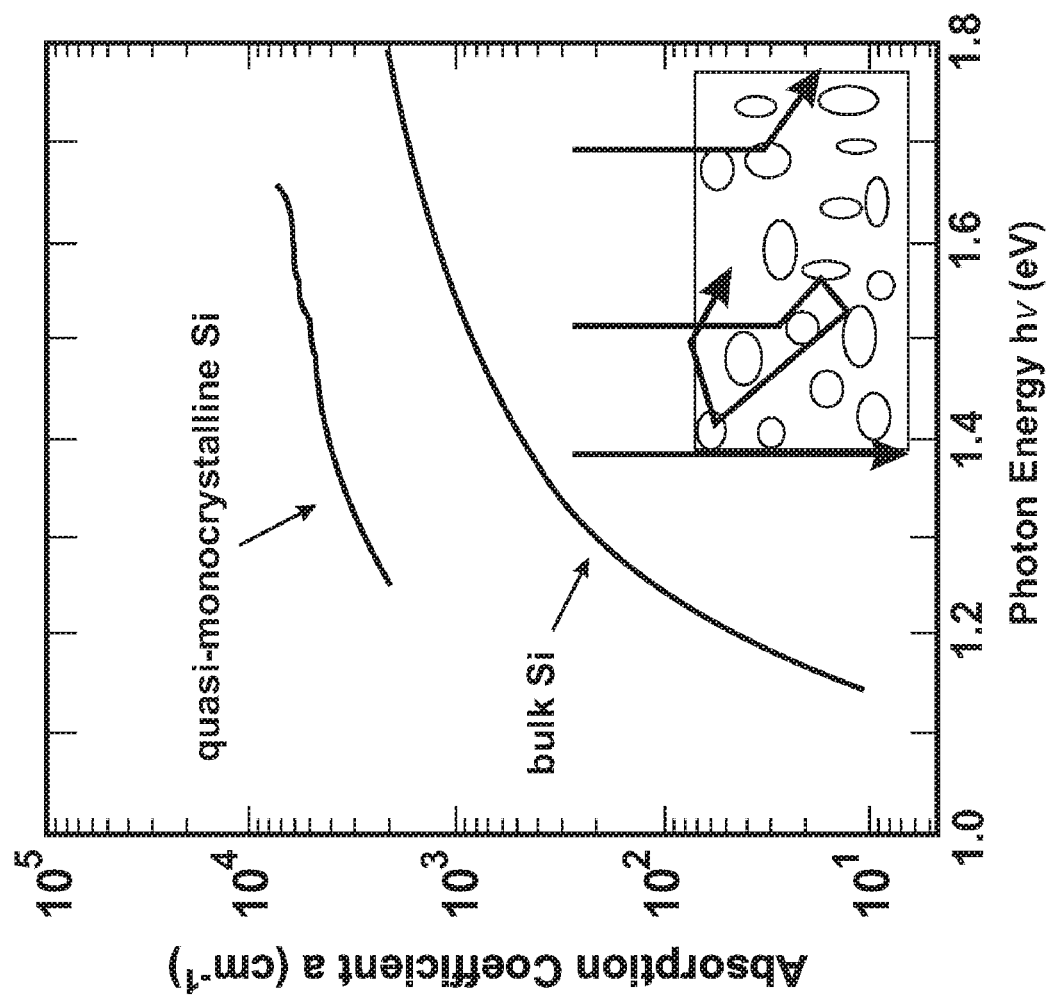
FIG. 1C is a simplified diagram of a plot illustrating photo energy absorption efficiency according to an embodiment of the present invention
Figure 2:
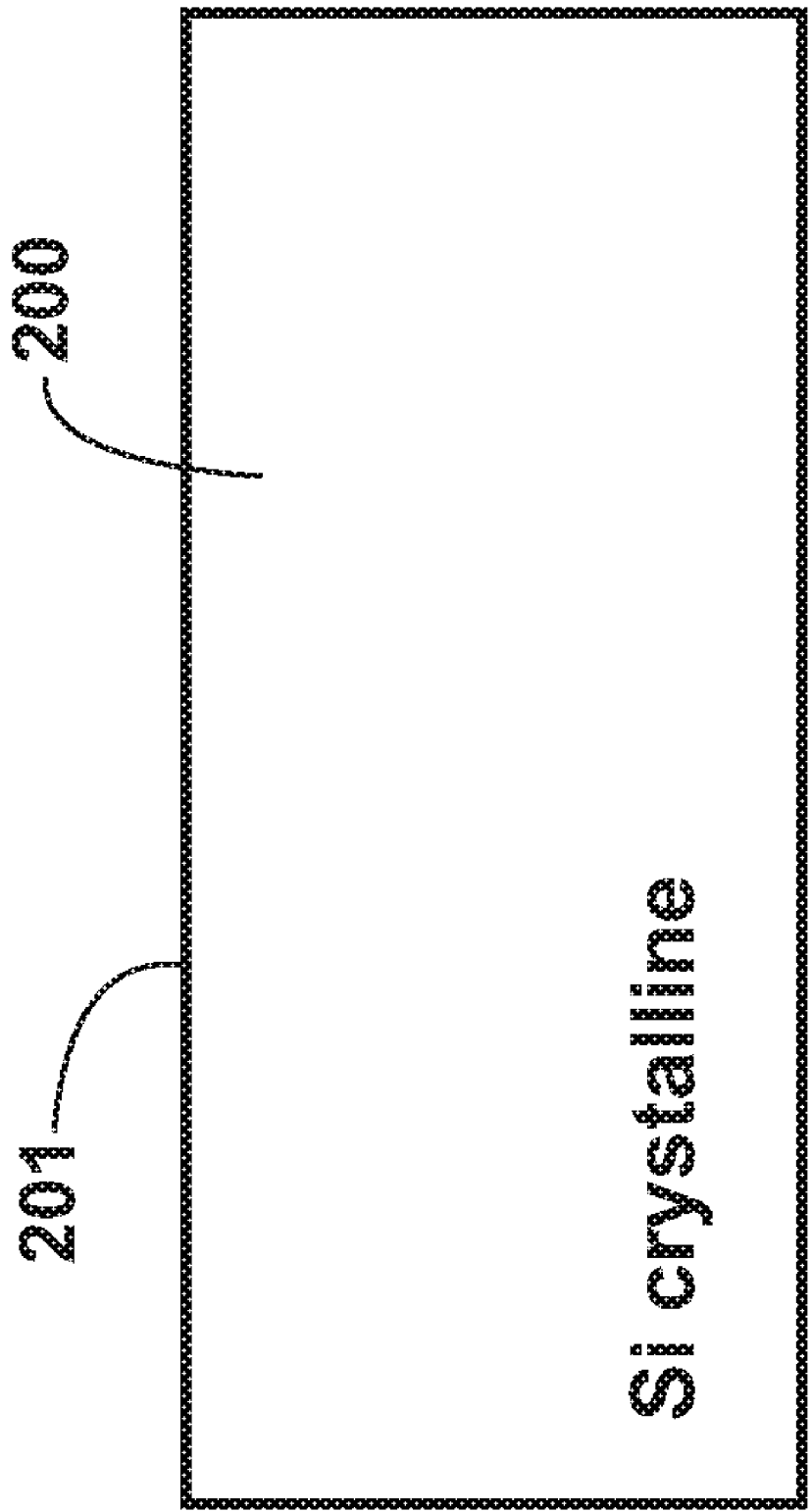
FIGS. 2 through 7 are simplified diagrams illustrating a method for fabricating a photovoltaic material according to an embodiment of the present invention.

As merely an example, the worm hole structures can have one or more dimension characteristics as illustrated in FIG. 1A. That is, the hole structures comprise a characteristic dimension ranging from about 1 nanometer to about 1 micron according to embodiments of the present invention. Additionally, the density distribution ranges from about $10/cm^3$ to about $10^{20}/cm^3$ according to embodiments of the present invention. In a specific embodiment, the density distribution ranges from a first density value at a vicinity of the support structure and a second density at a vicinity of the upper surface region, as illustrated by FIG. 1B. As shown, the vertical axis represents density in pores per volume and the horizontal axis represents a spatial dimension from the glue layer to the surface of the crystalline material according to a specific embodiment. Alternatively, the density distribution ranges from $10/cm^3$ to $10^{10}/cm^3$ at a vicinity of the support structure and $10^{10}/cm^3$ to $10^{20}/cm^3$ at a vicinity of the upper surface region according to a specific embodiment. As shown, the pores per volume increase from the interface region, which can be the glue layer, to the surface region according to a specific embodiment. Of course, there can be variations, modifications, and alternatives. As shown in FIG. 1C, the absorption efficiency of a quasi-monocrystalline silicon material is much higher than the bulk silicon material, as the pores within the quasi-monocrystalline silicon material traps photons for better energy absorption.

In a preferred embodiment, the device has a passivation material overlying the surface regions to cause a reduction of a electron-hole recombination process. In a specific embodiment, the crystalline material is single crystal silicon. Such single crystal silicon includes silicon molecules. Such molecules may be terminated using hydrogen or other species according to a specific embodiment. In a preferred embodiment, the termination causes passivation of the internal surfaces of the worm hole structures, which lead to a reduction of electron-hole recombination or other influences. In other embodiments, other species can be used to passivate the surface region of the worm hole structures. An example of the use of the worm hole structures in photovoltaic applications is described in U.S. Patent Application No. 60/951,472, commonly assigned, and hereby incorporated by reference herein. Of course, there can be other variations, modifications, and alternatives.

Referring again to FIG. 1, the device has a glue layer 103 provided between the support surface region and the thickness of crystalline material. In a specific embodiment, the glue layer is selected from spin on glass, an eutectic material, a polymer, or a metal layer. In a specific embodiment, the spin on glass is silicate or polysiloxane material, but can be others. In a specific embodiment, the eutectic material alloys are aluminum-silicon and indium-palladium, but can be others. In a specific embodiment, the polymer can be epoxy, which is organic in characteristic. Alternatively, the metal layer can be tungsten, tin or aluminum. In a preferred embodiment, the glue layer can be tungsten. Of course, there can be other variations, modifications, and alternatives.

In a specific embodiment, a textured surface region 107 is formed overlying from the upper surface region of the thickness of crystalline material. In a specific embodiment, the textured surface region has a roughness ranging from about 100 nanometers to about 10 microns. Depending upon the embodiment, the textured surface region is characterized by a surface roughness to facilitate capture of one or more photons being illuminated thereon. In other words, the textured surface region has a surface roughness of greater than about 100 nanometers to cause less than about 25% reflection from a total amount of irradiating in a wavelength ranging from about 0.1 micron to about 5 microns. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims. Further details of methods according to embodiments of the present invention are provided throughout the present specification and more particularly below.

In a specific embodiment, the present invention provides a method for fabricating a photovoltaic device that can be outlined as follows:

1. Provide a semiconductor substrate, e.g., single crystal silicon, silicon germanium, Group II/VI, Group III/V materials;
2. Form a crystalline material characterized by a plurality of worm hole structures therein overlying the semiconductor substrate
3. Subject the crystalline material to a hydrogen plasma species to occupy at least one or more of the worm hole structures therein of the crystalline material within a vicinity of an interface between the thickness of material and a remaining portion of the semiconductor substrate;
4. Provide a glue layer overlying a surface region of the crystalline material;
5. Join the surface region of the crystalline material via the glue layer to a permeable support substrate;
6. Process the joined crystalline material, glue layer, and permeable support substrate to remove volatile species from the glue layer through the permeable support substrate;
7. Cause curing the glue layer;
8. Delaminate a portion of the crystalline material from the semiconductor substrate;
9. Maintain attachment of the portion of the thickness of crystalline material to the support substrate during step (8);
10. Cause formation of a textured surface region from the portion of the thickness of crystalline material;
11. Use the overlying thickness of crystalline material having the plurality of worm hole structures on the support substrate for a photovoltaic application;
12. Perform other steps, as desired.

The above sequence of steps provides a method for fabricating a crystalline worm hole structure provided on a permeable substrate for photovoltaic applications according to an embodiment of the present invention. As shown, the method uses a combination of steps including a way of forming the crystalline material, which will be detached according to a specific embodiment. In a preferred embodiment, the method also uses a permeable substrate, which allows for one or more volatile species in the glue layer to degas from the glue layer. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 7 are simplified diagrams illustrating a method for fabricating a photovoltaic material according to an embodiment of the present invention. These diagrams are merely examples, which should not unduly limit the scope of the claims herein. One of ordinary skill in the art would recognize many variations, modifications, and alternatives.

In a specific embodiment, the present invention provides a method for fabricating a photovoltaic material. The method includes providing a semiconductor substrate 200. As an example, the material can be single crystal silicon, silicon germanium, gallium arsenide, Group II/VI, or Group III/V materials. Alternatively, the material can be composites, layered, graded, or others, depending upon the specific embodiment. Of course, there can be other variations, modifications, and alternatives.

Figure 3:
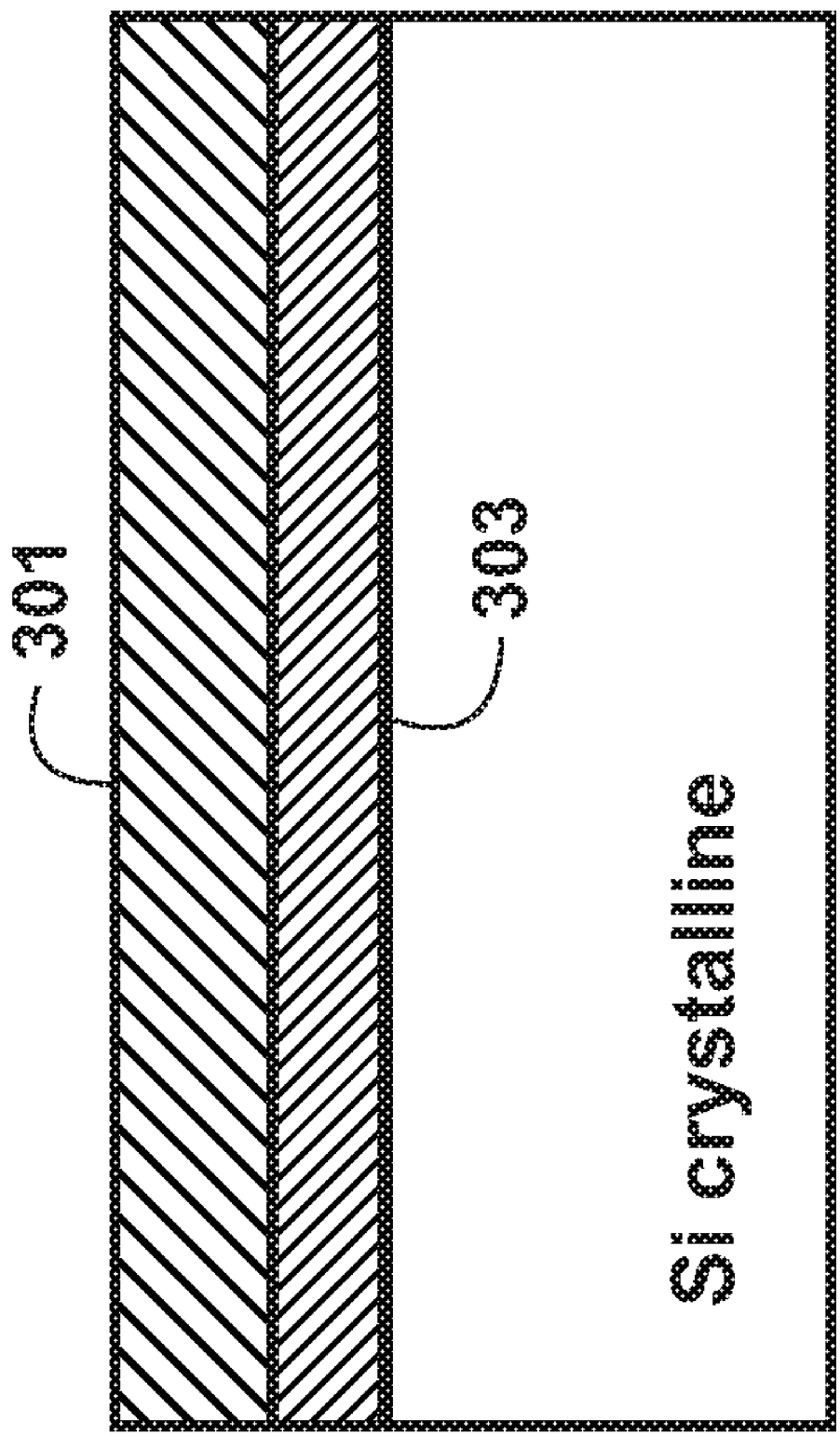

In a specific embodiment, the method includes forming a crystalline material characterized by a plurality of worm hole structures therein overlying the semiconductor substrate as illustrated in FIG. 3. In a specific embodiment, the method includes subjecting the surface region 201 of the semiconductor material to an electrochemical process to cause formation of a pores per volume density gradient ranging from a lower density at surface 301 to a higher density at interface region 303, which is a remaining portion of the semiconductor material. In a preferred embodiment, the semiconductor material is crystalline and/or like structure. Of course, there can be other variations, modifications, and alternatives.

As merely an example, the method uses an electrochemical etching process to cause formation of the worm hole structures. In a specific embodiment, the electrochemical etching processes uses a HF anodic attack chemistry. Such chemistry is provided using a bath of HF-containing solution according to a specific embodiment. A voltage of about tens of volts is provided between the crystalline material, which is used as a first electrode and a noble metal, which is a second electrode according to a specific embodiment. Pores per volume density of the wafer can be controlled by varying the applied current density. Switching the current density from high to low current enables the formation of a low-pore density surface and a high-pore density buried layer. The dimension of the pore, and therefore the pores per volume density, can also be controlled by varying the concentration of the HF-containing solution. Increasing the portion of HF in the solution results in smaller pore formations and higher pore densities. Alternatively, pore per volume density can further be controlled by the doping level of impurity inside the substrate material and the light illumination level during pore formation. Of course, there can be other variations, modifications, and alternatives.

In a specific embodiment, the worm hole structures are characterized by a density distribution from the surface region 301 of the crystalline material to a defined depth 303 within a z-direction of the surface region to form a thickness of material to be detached. In a specific embodiment, the worm hole structures are characterized by a density distribution. In a specific embodiment, the worm hole pore density is lower near the surface region than at the interface region. Of course, there can be variations, modifications, and alternatives.

As merely an example, the worm hole structures can have one or more dimension characteristics. That is, the hole structures comprise a characteristic dimension ranging from about 1 nanometer to about 1 micron according to embodiments of the present invention. Additionally, the density distribution ranges from about $10/cm^3$ to about $10^{20}/cm^3$ according to embodiments of the present invention. Of course, there can be variations, modifications, and alternatives.

Figure 4:
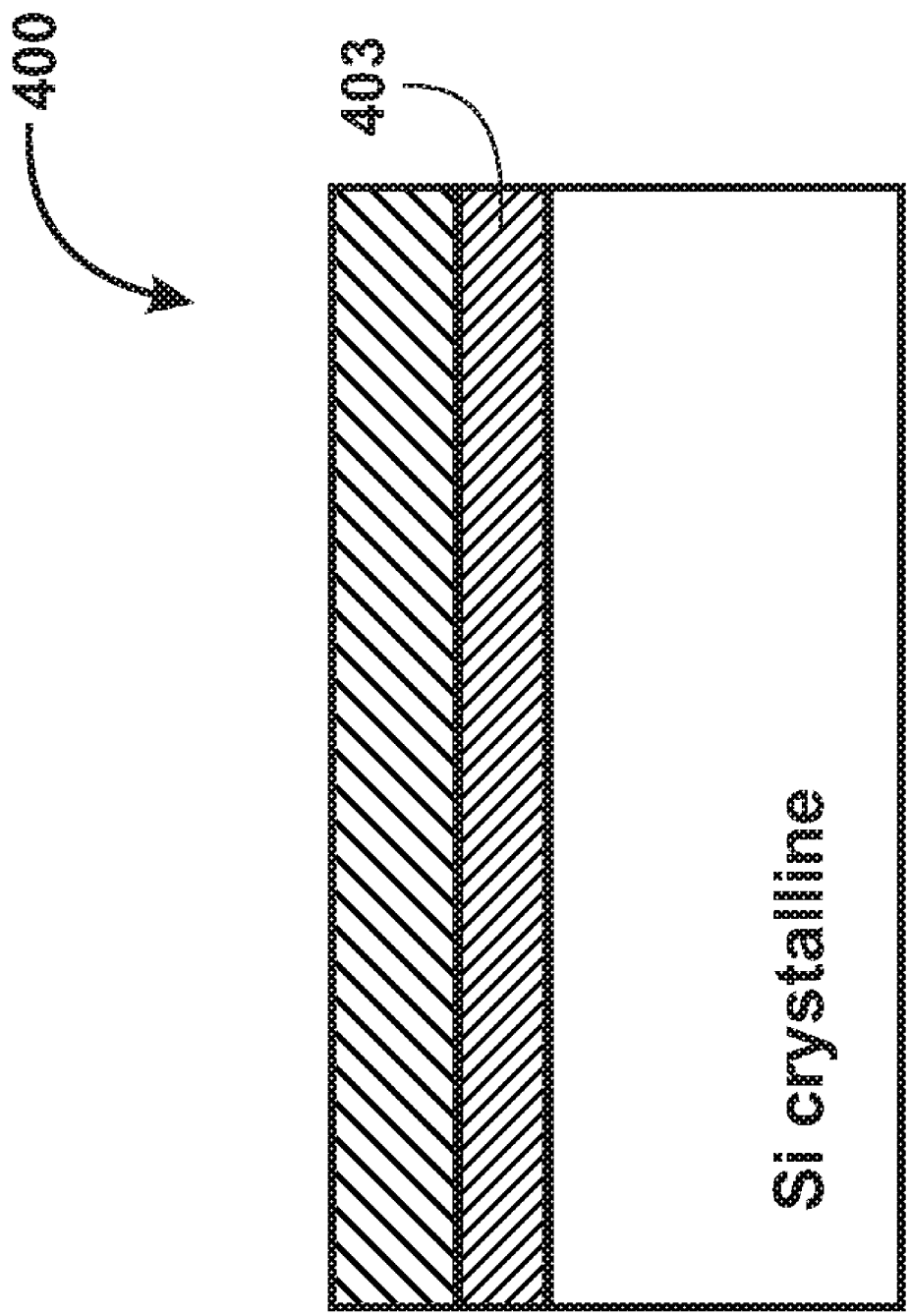

In a specific embodiment, the method includes subjecting 400 the crystalline material to a hydrogen plasma species as illustrated by FIG. 4. Such plasma treatment can be used to occupy at least one or more of the worm hole structures therein of the crystalline material within a vicinity of an interface between the thickness of material and a remaining portion of the semiconductor substrate according to a specific embodiment. A higher concentration of hydrogen species accumulates at region 403, which has a higher pores per volume density according to a specific embodiment. In a specific embodiment, the accumulation of hydrogen can range from a concentration of about $10^{18}/cm^3$ to about $10^{22}/cm^3$. In a preferred embodiment, the hydrogen concentration is about $10^{21}/cm^3$ and greater to add stress within region 403, which serves as a cleave region. Of course, there can be other variations, modifications, and alternatives.

Figure 5:
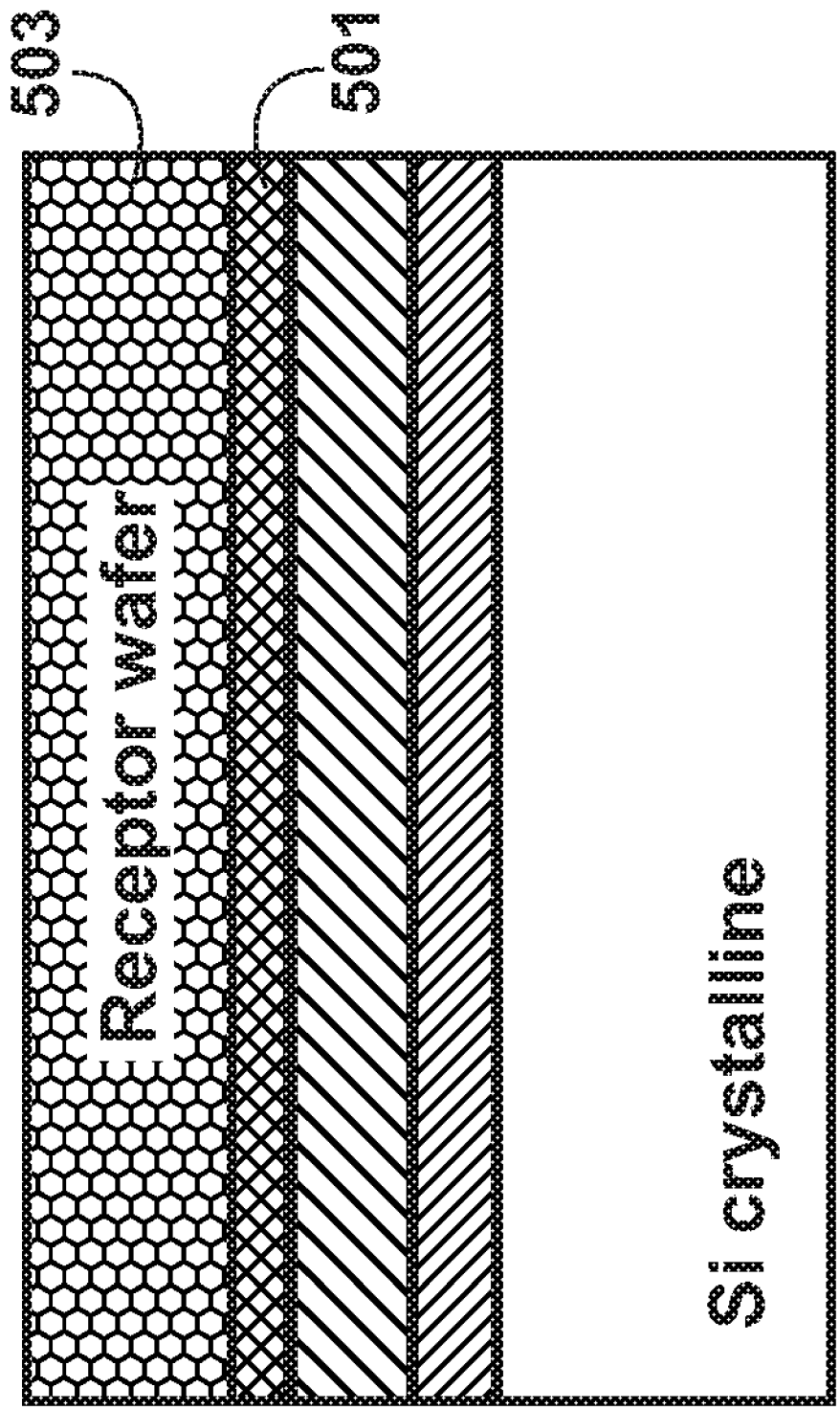

Referring to FIG. 5, the method includes providing a glue layer 501 overlying a surface region of the crystalline material. Depending upon the embodiment, the glue layer can be provided on a support member 503 or surface region of a rigid material. In a specific embodiment, the glue layer is selected from spin on glass, a eutectic material, a polymer, or a metal layer. In a specific embodiment, the spin on glass is silicate or polysiloxane material, but can be others. In a specific embodiment, the eutectic material alloys are aluminum-silicon and indium-palladium. In a specific embodiment, the polymer can be epoxy, which is organic in characteristic. Alternatively, the metal layer can be tungsten, tin or aluminum. In a preferred embodiment, the glue layer is tungsten. Of course, there can be other variations, modifications, and alternatives.

In a specific embodiment, the method joins the surface region of the crystalline material via the glue layer to a support substrate 503. In a specific embodiment, the support substrate can be a permeable or textile like metal, dielectric, or semiconductor, or any combination of these. The support substrate can also be an organic polymer material, composite, or other structural entity according to a specific embodiment. As merely an example, the metal can be a permeable or textile like stainless steel, aluminum, molybdenum, titanium, or silicides, including oxides of these metals. As merely an example, the dielectric material can be a permeable or textile like glass, quartz, organic polymer, or ceramics. As merely an example, the semiconductor can be a permeable or textile like silicon, including amorphous silicon, polysilicon, metallurgical silicon, and other forms of silicon. Of course, there can be other variations, modifications, and alternatives.

In a specific embodiment, the present method includes processing the joined crystalline material, glue layer, and permeable support substrate to remove volatile species from the glue layer through the permeable support substrate. In a specific embodiment, a substantial portion of the volatile species, which are provided in an uncured glue layer, can be removed through the permeable support substrate. In a specific embodiment, the permeable support substrate facilitates out-gassing or degassing to cause curing of the glue layer. That is, the volatile species often become trapped between a non-permeable layer transferable layer and the support substrate. By way of the permeable support substrate member, volatile species can escape and allow for thermal energy and/or other chemical species to traverse through the permeable support member and cure the glue layer. Of course, there can be other variations, modifications, and alternatives.

Figure 6:
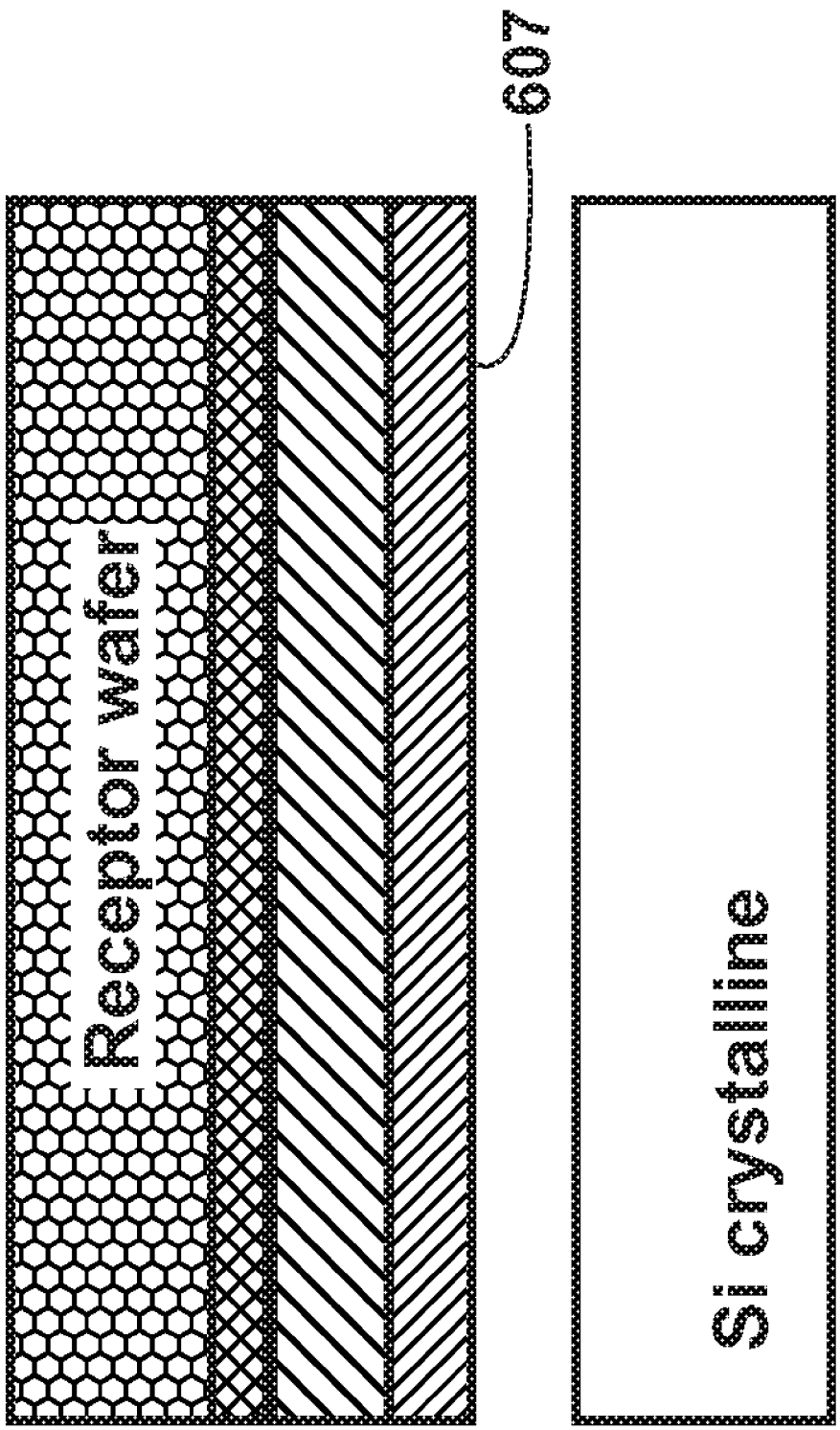

In a preferred embodiment, the method includes delaminating a portion of the crystalline material from the semiconductor substrate as illustrated in FIG. 6. In a specific embodiment, delamination occurs using thermal, chemical, mechanical, gravitational, electromagnetic, or other energy sources, including combinations of such sources. In a preferred embodiment, delamination occurs using thermal treatment by subjecting the bonded structure from 200 to 500 degrees Celsius for a period from 10 to 100 minutes to cause release at the cleave region from the remaining substrate portion, as shown. As shown, the delamination occurs while the portion of the thickness of crystalline material remains attached to the support substrate, to cause formation of a textured surface region from the portion of the thickness of crystalline material. Of course, there can be other variations, modifications, and alternatives.

In a specific embodiment, a textured surface region 607 is formed from a detached surface region of the thickness of crystalline material. In a specific embodiment, the textured surface region has a roughness ranging from about 100 nanometers to about 10 microns. Depending upon the embodiment, the textured surface region is characterized by a surface roughness to facilitate capture of one or more photons being illuminated thereon. In other words, the textured surface region has a surface roughness of greater than about 100 nanometers to cause less than about 25% reflection from a total amount of irradiating in a wavelength ranging from about 0.1 micron to about 5 microns. Of course, there can be other variations, modifications, and alternatives.

Figure 7:
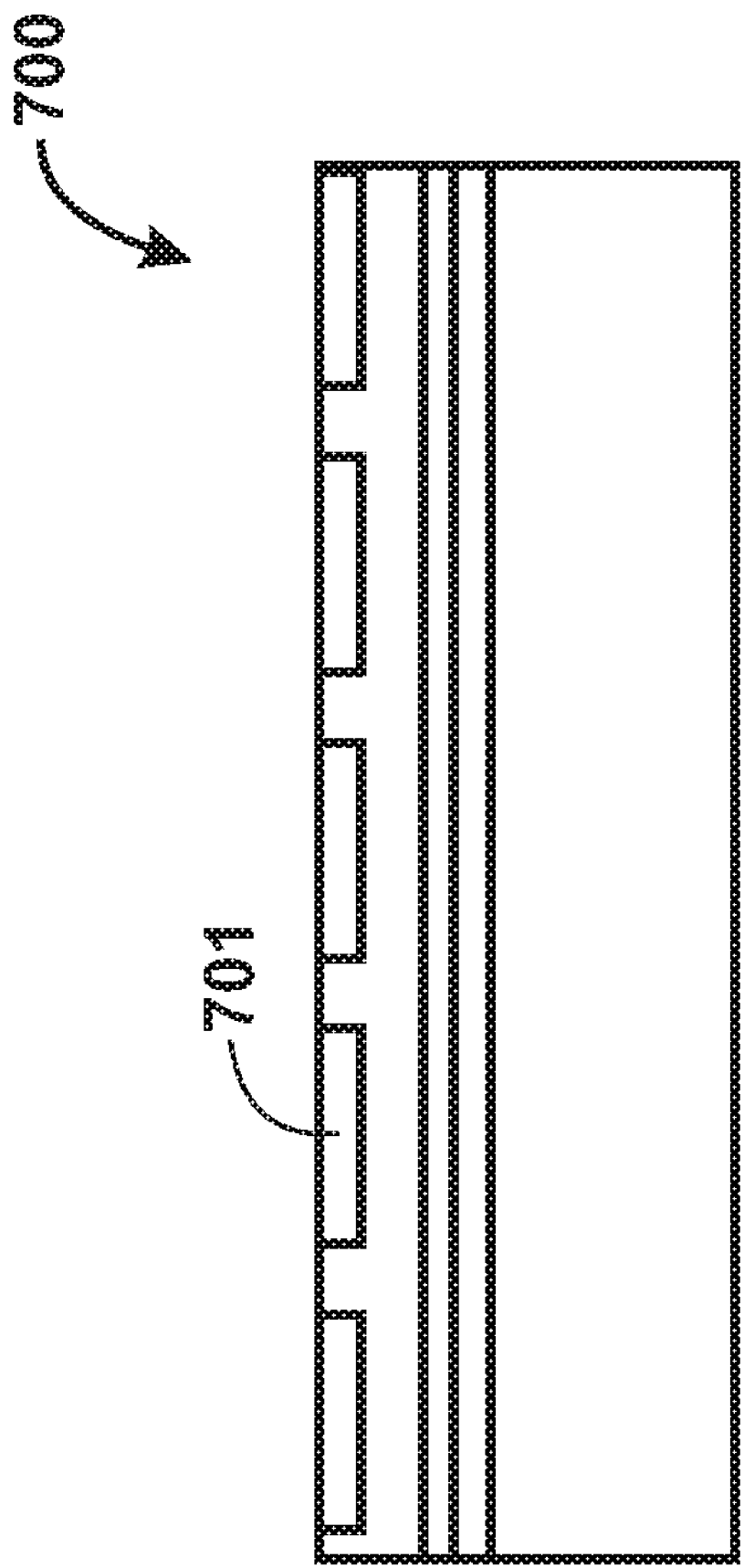
Figure 8:
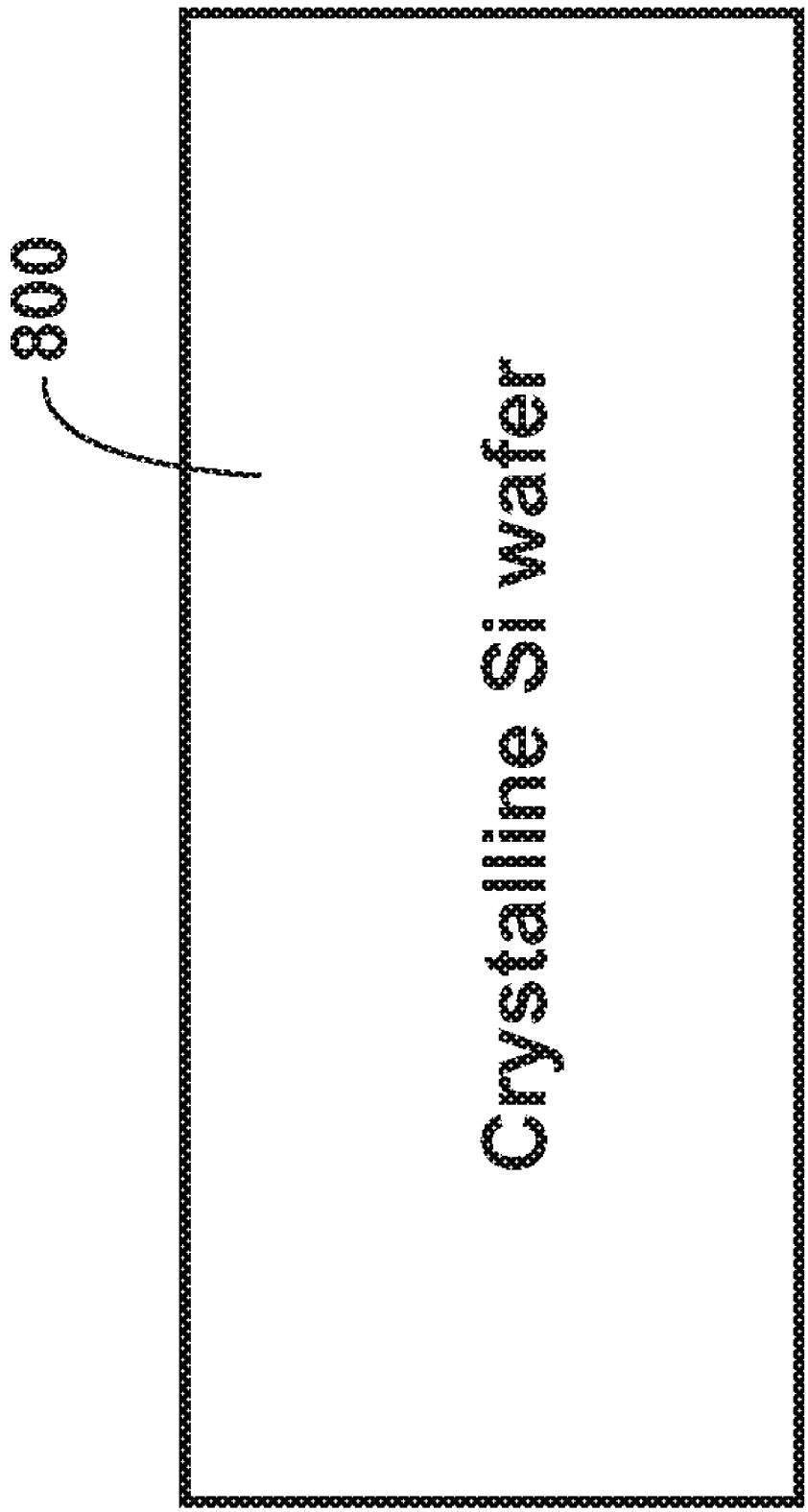
FIGS. 8 through 13 are simplified diagrams illustrating a method for fabricating a photovoltaic material according to an embodiment of the present invention.

Referring to FIG. 7, the method includes using the overlying thickness of crystalline material having the plurality of worm hole structures on the support substrate for a photovoltaic application according to a specific embodiment. In a specific embodiment, the method includes forming one or more photovoltaic devices 701 on a portion of the crystalline material. Depending upon the embodiment, such devices can be formed using implantation/diffusion and other techniques for introducing impurities into the crystalline material. In a preferred embodiment, the device also includes metallization for electrodes and other features. Of course, there can be other variations, modifications, and alternatives.

The above sequence of steps provides a method for fabricating a crystalline worm hole structure for photovoltaic applications according to an embodiment of the present invention. As shown, the method uses a combination of steps including a way of forming the crystalline material, which will be detached according to a specific embodiment. Other alternatives can also be provided where steps are added, one or more steps are removed, or one or more steps are provided in a different sequence without departing from the scope of the claims herein. Alternative methods according to specific embodiments can be found throughout the present specification and more particularly below.

In a specific embodiment, the present invention provides a method for fabricating a photovoltaic device that can be outlined as follows:
1. Provide a semiconductor substrate, e.g., single crystal silicon, silicon germanium, Group II/VI, Group III/V materials;
2. Form a crystalline material characterized by a plurality of worm hole structures therein overlying the semiconductor substrate
3. Subject the crystalline material to a hydrogen plasma species to occupy at least one or more of the worm hole structures therein of the crystalline material within a vicinity of an interface between the thickness of material and a remaining portion of the semiconductor substrate to form a cleave region;
4. Form a passivation layer overlying internal surface regions of the worm hole structures;
5. Provide a glue layer overlying a surface region of the crystalline material;
6. Join the surface region of the crystalline material via the glue layer to a support substrate;
7. Delaminate a portion of the crystalline material from the semiconductor substrate;
8. Maintain attachment of the portion of the thickness of crystalline material to the support substrate during step (7);
9. Cause formation of a textured surface region from the portion of the thickness of crystalline material;
10. Use the overlying thickness of crystalline material having the plurality of worm hole structures on the support substrate for a photovoltaic application;
11. Perform other steps, as desired.

The above sequence of steps provides a method for fabricating a crystalline worm hole structure for photovoltaic applications according to an embodiment of the present invention. As shown, the method uses a combination of steps including a way of forming the crystalline material, which will be detached according to a specific embodiment. In a preferred embodiment, the method also forms a passivation on internal surfaces of the worm hole structures. Other alternatives can also be provided where steps are added, one or more steps are removed, or one or more steps are provided in a different sequence without departing from the scope of the claims herein. Further details of the present method can be found throughout the present specification and more particularly below.

FIGS. 8 through 13 are simplified diagrams illustrating a method for fabricating a photovoltaic material according to an embodiment of the present invention. These diagrams are merely examples, which should not unduly limit the scope of the claims herein. One of ordinary skill in the art would recognize many variations, modifications, and alternatives. In a specific embodiment, the present invention provides a method for fabricating a photovoltaic material. The method includes providing a semiconductor substrate 800. As an example, the material can be single crystal silicon, silicon germanium, gallium arsenide, Group II/VI, or Group III/V materials. Alternatively, the material can be composites, layered, graded, or others, depending upon the specific embodiment. Of course, there can be other variations, modifications, and alternatives.

Figure 9:
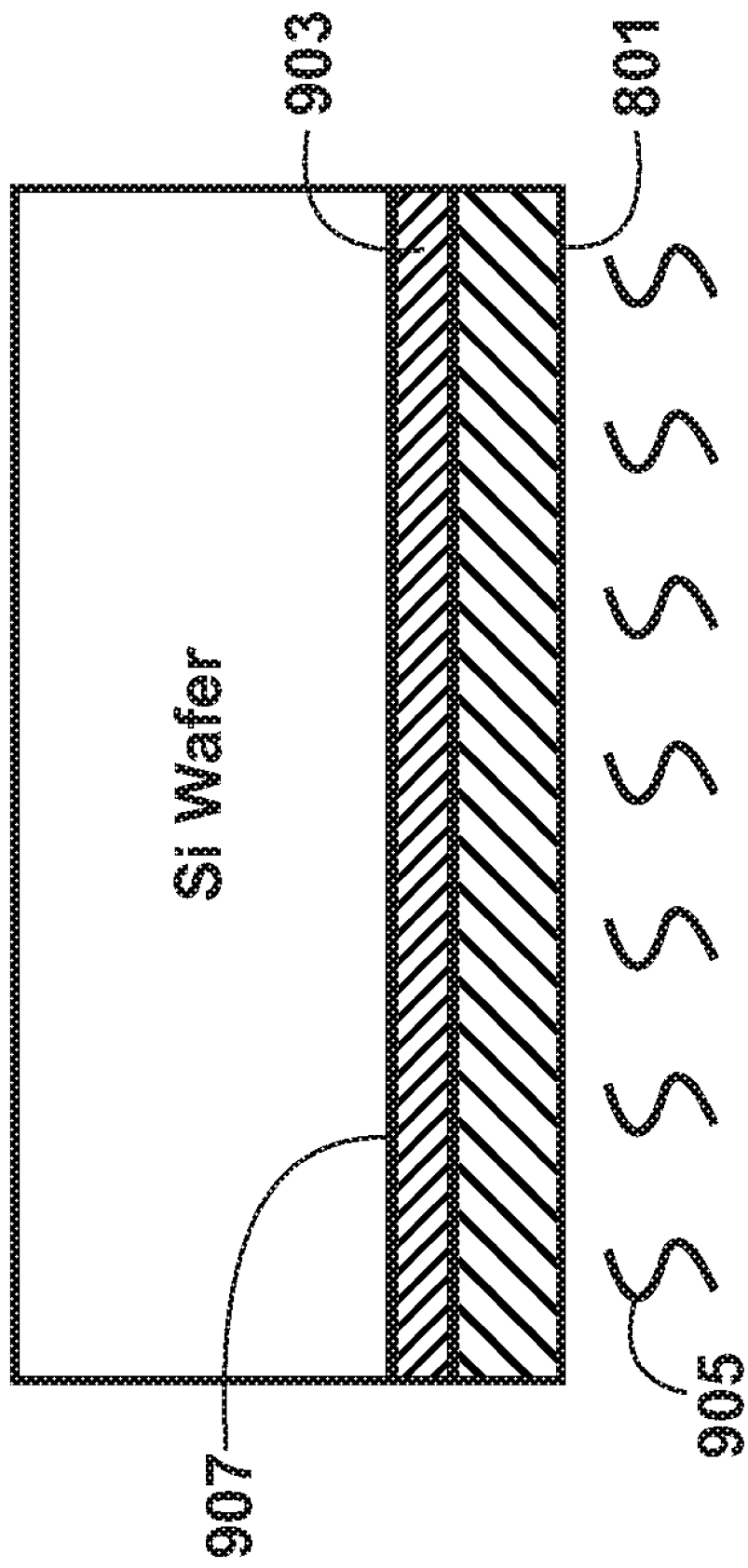

In a specific embodiment, the method includes forming a crystalline material characterized by a plurality of worm hole structures therein overlying the semiconductor substrate as illustrated in FIG. 9. In a specific embodiment, the method includes subjecting the surface region 801 of the semiconductor material to an electrochemical process to cause formation of a pores-per-volume density gradient ranging from a lower density at surface to a higher density at interface region, which is a remaining portion of the semiconductor material. In a preferred embodiment, the semiconductor material is crystalline and/or like structure. Of course, there can be other variations, modifications, and alternatives.

As merely an example, the method uses an electrochemical etch process to cause formation of the worm hole structures. In a specific embodiment, the electrochemical etch processes uses a HF anodic attack chemistry. Such chemistry is provided using a bath of HF-containing solution according to a specific embodiment. A voltage of about tens of volts is provided between the crystalline material, which is used as a first electrode and a noble metal, which is a second electrode according to a specific embodiment. Pores per volume density of the wafer can be controlled by varying the applied current density. Switching the current density from high to low current enables the formation of a low-pore density surface and a high-pore density buried layer. The dimension of the pore, and therefore the pores per volume density, can also be controlled by varying the concentration of the HF-containing solution. Increasing the portion of HF in the solution results in smaller pore formations and higher pore densities. Alternatively, pore per volume density can further be controlled by the doping level of impurity inside the substrate material and the light illumination level during pore formation. Of course, there can be other variations, modifications, and alternatives.

In a specific embodiment, the worm hole structures are characterized by a density distribution from the surface region of the crystalline material to a defined depth 903 within a z-direction of the surface region to form a thickness of material to be detached. In a specific embodiment, the worm hole structures are characterized by a density distribution. In a specific embodiment, the worm hole pore density is lower near the surface region than at the interface region. Of course, there can be variations, modifications, and alternatives.

As merely an example, the worm hole structures can have one or more dimension characteristics. That is, the hole structures comprise a characteristic dimension ranging from about 1 nanometer to about 1 micron according to embodiments of the present invention. Additionally, the density distribution ranges from about $10/cm^3$ to about $10^{20}/cm^3$ according to embodiments of the present invention. Of course, there can be variations, modifications, and alternatives.

In a specific embodiment, the method includes subjecting 905 the crystalline material to a hydrogen plasma species as illustrated by FIG. 9. Such plasma treatment can be used to occupy at least one or more of the worm hole structures therein of the crystalline material within a vicinity of an interface between the thickness of material and a remaining portion of the semiconductor substrate according to a specific embodiment. A higher concentration of hydrogen species accumulates at region 907, which has a higher pores per volume density according to a specific embodiment. In a specific embodiment, the accumulation of hydrogen can range from a concentration of about $10^{18}/cm^3$ to about $10^{22}/cm^3$. In a preferred embodiment, the hydrogen concentration is about $10^{21}/cm^3$ and greater to add stress within region 907, which serves as a cleave region. Of course, there can be other variations, modifications, and alternatives.

In a specific embodiment, the method includes passivating one or more internal surface regions of the worm hole structure according to an embodiment of the present invention. In a specific embodiment, the passivating can occur using hydrogen treatment or other treatment process, which can occur during any one of these processes or others. In a preferred embodiment, the internal surface structures have a passivation material overlying the surface regions to cause a reduction of an electron-hole recombination process. In a specific embodiment, the crystalline material is single crystal silicon. Such single crystal silicon includes silicon molecules. Such molecules may be terminated using hydrogen or other species according to a specific embodiment. In a preferred embodiment, the termination causes passivation of the internal surfaces of the worm hole structures, which lead to a reduction of electron-hole recombination or other influences. In other embodiments, other species can be used to passivate the surface region of the worm hole structures. Of course, there can be other variations, modifications, and alternatives.

Figure 10:
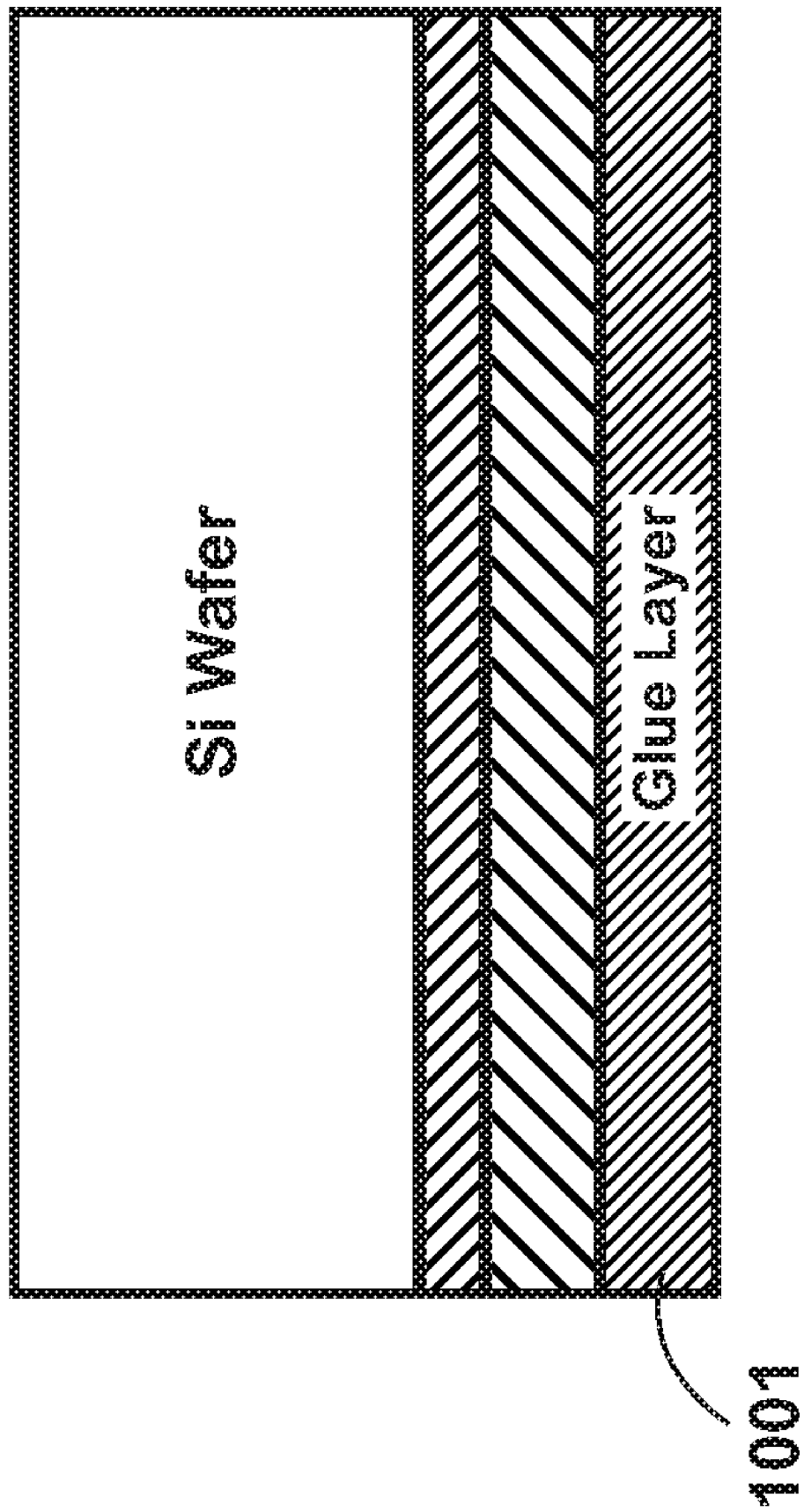
Figure 11:
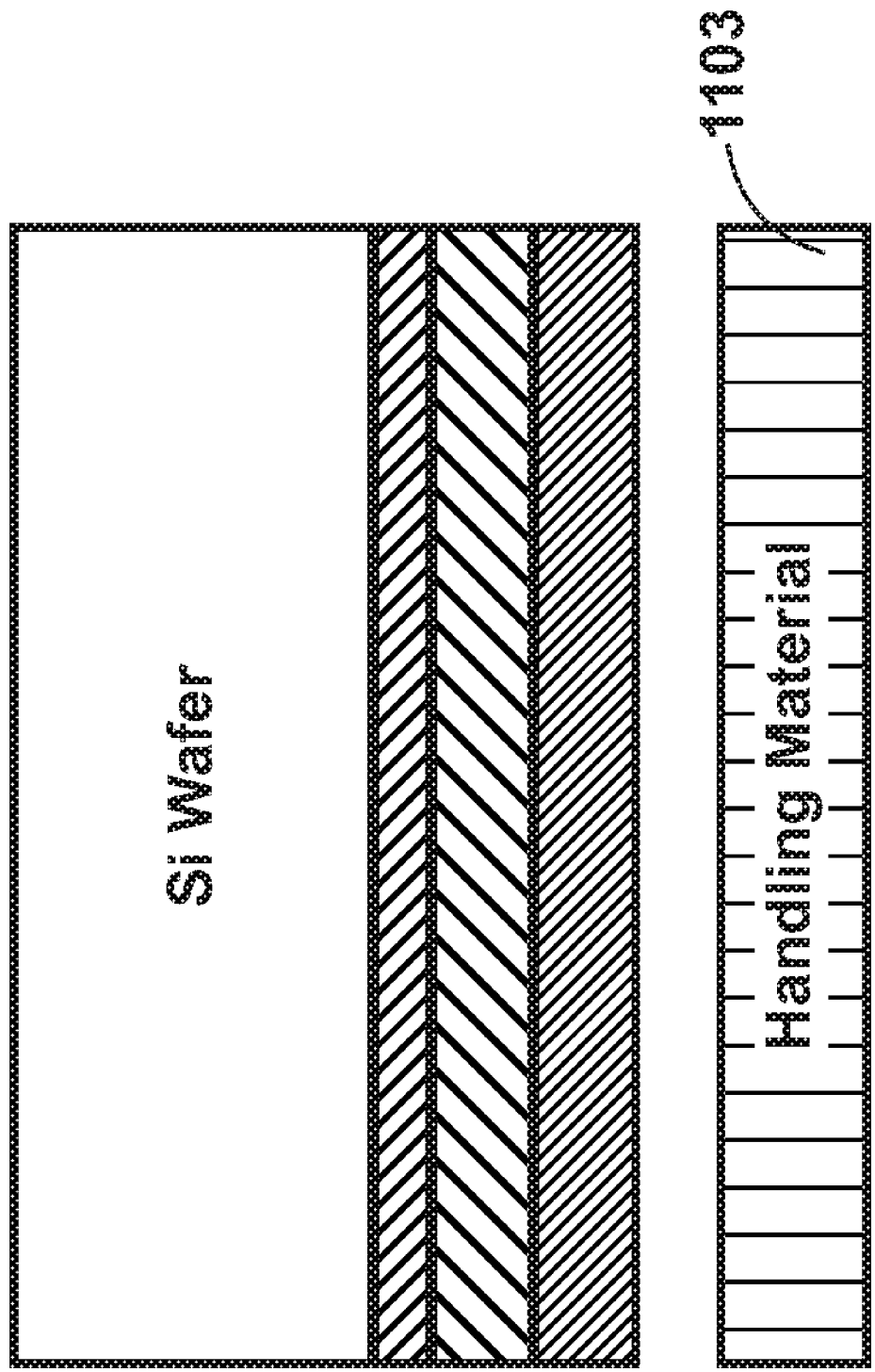

Referring to FIGS. 10 and 11, the method includes providing a glue layer 1101 overlying a surface region of the crystalline material. Depending upon the embodiment, the glue layer can be provided on a permeable or textile like support member 1103 or surface region of crystalline material. In a specific embodiment, the glue layer is selected from spin on glass, a eutectic material, a polymer, or a metal layer. In a specific embodiment, the spin on glass is silicate or polysiloxane material, but can be others. In a specific embodiment, the eutectic material alloys are aluminum-silicon and indium-palladium. In a specific embodiment, the polymer can be epoxy, which is organic in characteristic. Alternatively, the metal layer can be tungsten, tin or aluminum. In a specific embodiment, the glue layer is tungsten. Of course, there can be other variations, modifications, and alternatives.

In a specific embodiment, the method joins the surface region of the crystalline material via the glue layer to a support substrate 1103. In a specific embodiment, the support substrate can be a permeable or textile like metal, dielectric, or semiconductor, or any combination of these. The support substrate can also be an organic polymer material, composite, or other structural entity according to a specific embodiment. As merely an example, the metal can be a permeable or textile like stainless steel, aluminum, molybdenum, titanium, or silicides, including oxides of these metals. As merely an example, the dielectric material can be a permeable or textile like glass, quartz, organic polymer, or ceramics. As merely an example, the semiconductor can be a permeable or textile like silicon, including amorphous silicon, polysilicon, metallurgical silicon, and other forms of silicon. Of course, there can be other variations, modifications, and alternatives.

Figure 12:
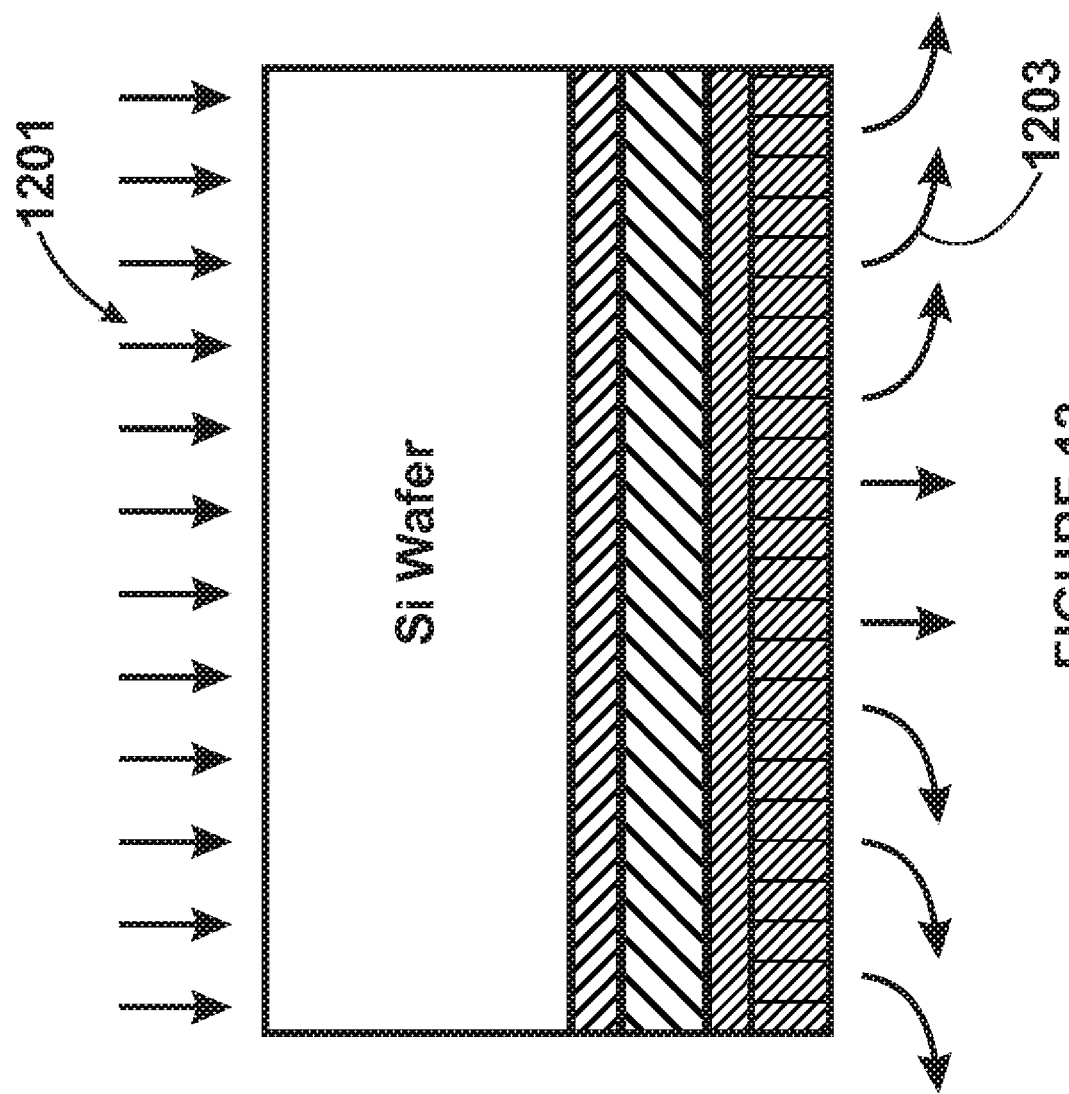

In a specific embodiment, the present method includes processing 1201 the joined crystalline material, glue layer, and permeable support substrate as illustrated by FIG. 12. As shown, processing is provided to remove volatile species from the glue layer through the permeable support substrate. In a specific embodiment, processing includes thermal treatment (e.g., heat), chemical treatment, irradiation, and other techniques alone or in combination of these. In a specific embodiment, the substantial portion of the volatile species, which are provided in an uncured glue layer, can be removed through the permeable support substrate. In a specific embodiment, the permeable support substrate facilitates outgassing or degassing 1203 to cause curing of the glue layer. That is, the volatile species often become trapped between a non-permeable layer transferable layer and the support substrate. By way of the permeable support substrate member, volatile species can escape and allow for thermal energy and/or other chemical species to traverse through the permeable support member and cure the glue layer. Of course, there can be other variations, modifications, and alternatives.

Figure 13:
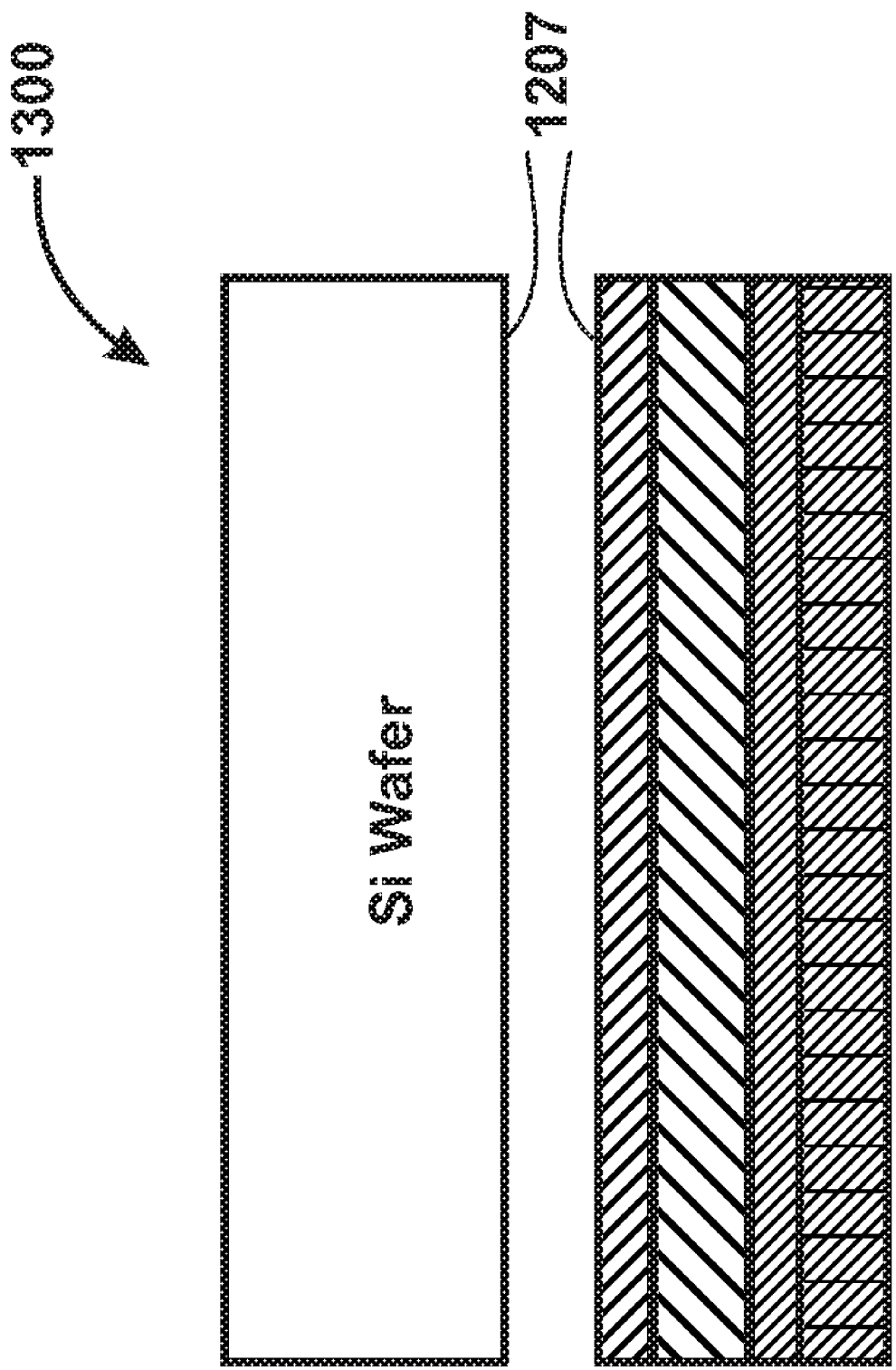

In a preferred embodiment, the method includes delaminating 1300 a portion of the crystalline material from the semiconductor substrate as illustrated in FIG. 13. In a specific embodiment, delamination occurs using thermal, chemical, mechanical, gravitational, electromagnetic, or other energy sources, including combinations of such sources. In a preferred embodiment, delamination occurs using thermal treatment by subjecting the bonded structure from 200 to 500 degrees Celsius for a period from 10 to 100 minutes to cause release at the cleave region from the remaining substrate portion, as shown. As shown, the delamination occurs while the portion of the thickness of crystalline material remains attached to the support substrate, to cause formation of a textured surface region from the portion of the thickness of crystalline material. Of course, there can be other variations, modifications, and alternatives.

In a specific embodiment, the method includes passivating one or more internal surface regions of the worm hole structure according to an embodiment of the present invention. In a specific embodiment, the passivating can occur using hydrogen treatment or other treatment process, which can occur during any one of these processes or others. Of course, there can be other variations, modifications, and alternatives.

In a specific embodiment, a textured surface region 1207 is formed from a detached surface region of the thickness of crystalline material. In a specific embodiment, the textured surface region has a roughness ranging from about 100 nanometers to about 10 microns. Depending upon the embodiment, the textured surface region is characterized by a surface roughness to facilitate capture of one or more photons being illuminated thereon. In other words, the textured surface region has a surface roughness of greater than about 100 nanometers to cause less than about 25% reflection from a total amount of irradiating in a wavelength ranging from about 0.1 micron to about 5 microns. Of course, there can be other variations, modifications, and alternatives.

Figure 14:
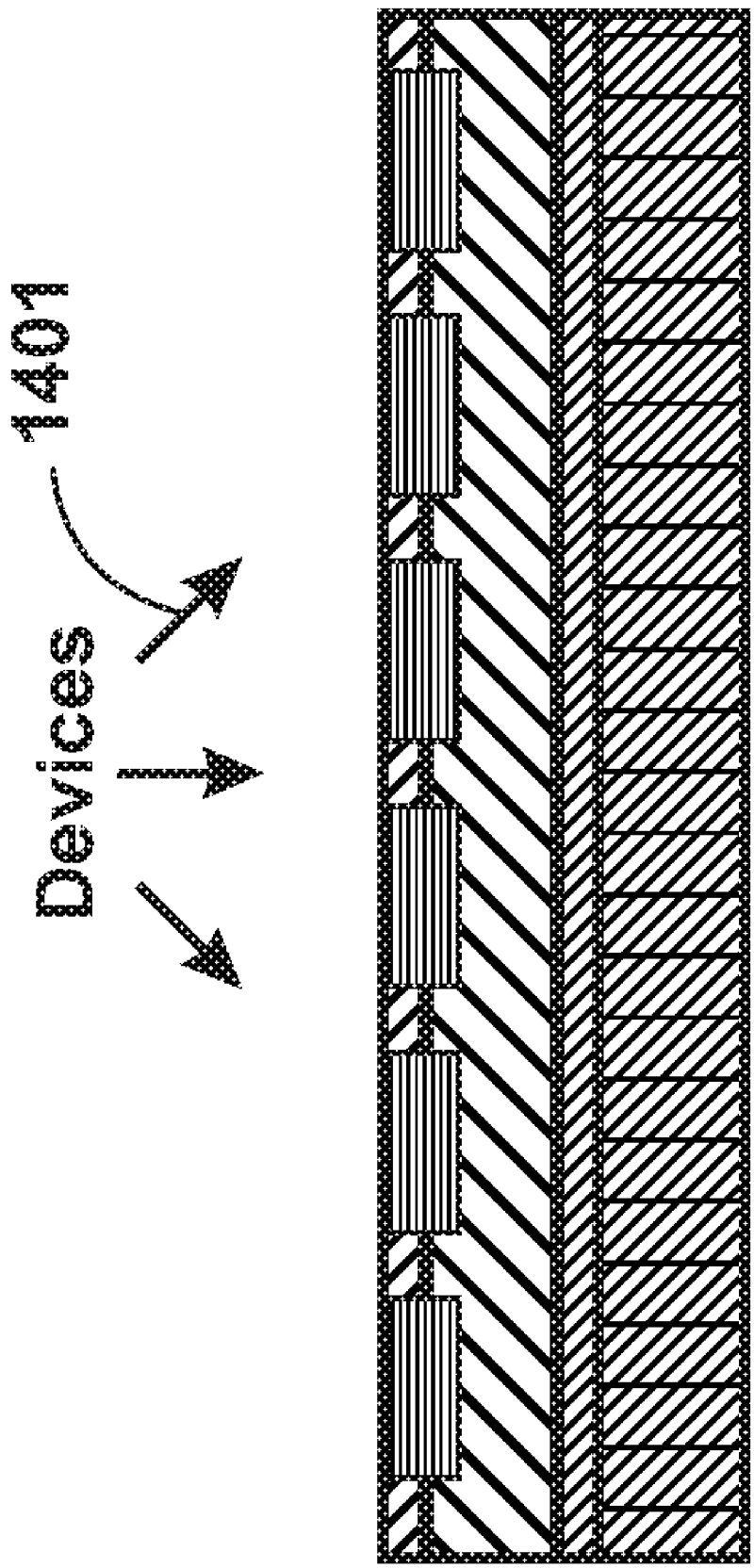
FIG. 14 is a simplified side-view diagram of a photovoltaic device according to an embodiment of the present invention.

Referring to FIG. 14, the method includes using the overlying thickness of crystalline material having the plurality of worm hole structures on the support substrate for a photovoltaic application according to a specific embodiment. In a specific embodiment, the method includes forming one or more photovoltaic devices 1401 on a portion of the crystalline material. Depending upon the embodiment, such devices can be formed using implantation/diffusion and other techniques for introducing impurities into the crystalline material. In a preferred embodiment, the device also includes metallization for electrodes and other features. Of course, there can be other variations, modifications, and alternatives.

Figure 15:
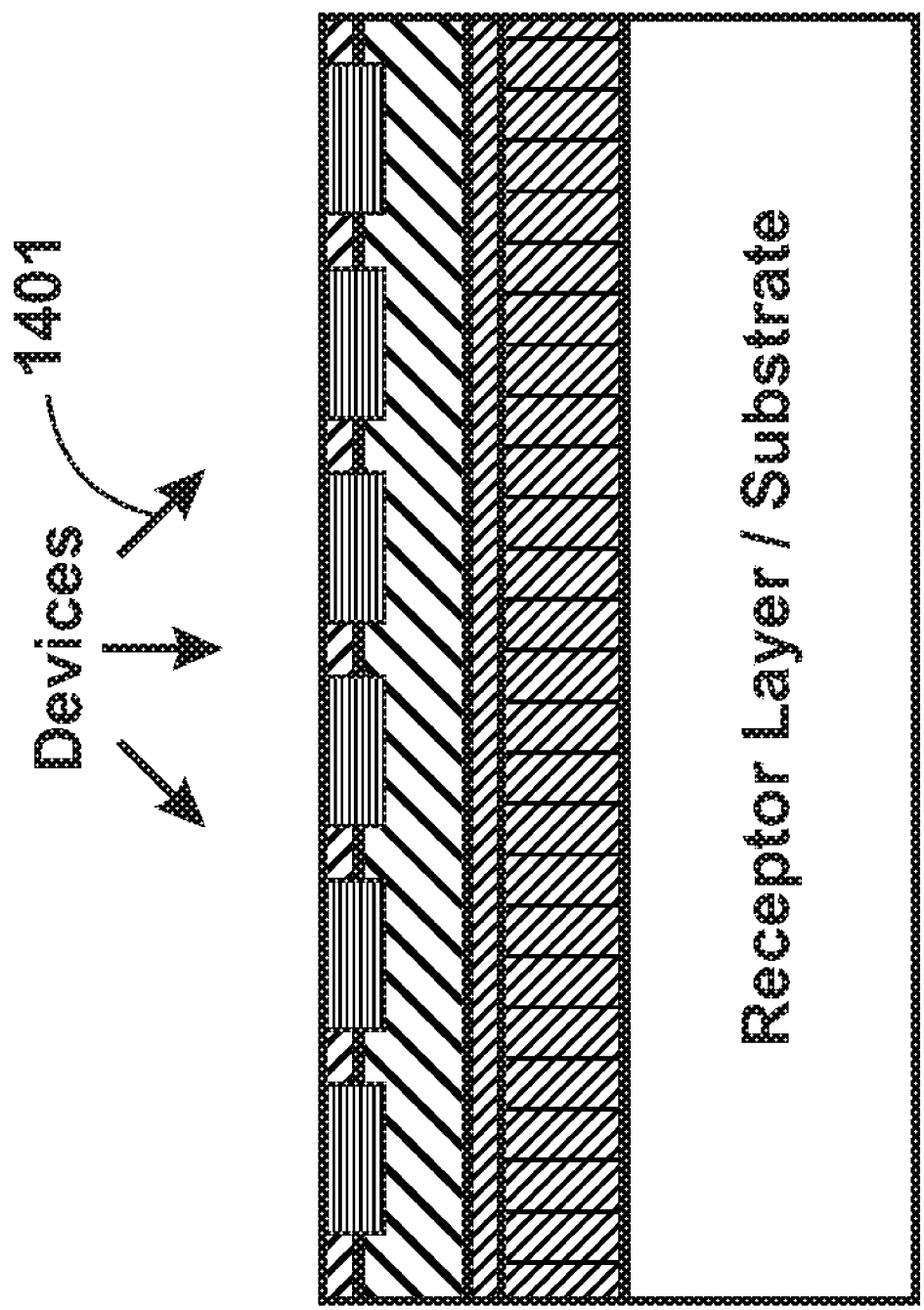
FIG. 15 is a simplified side-view diagram of an alternative photovoltaic device according to an embodiment of the present invention.

Referring now to FIG. 15, the method also includes forming an overlying receptor layer overlying the permeable substrate member. In a specific embodiment, the receptor layer can be a thickened material, such has been sprayed, deposited, or the like. Of course, there can be other variations, modifications, and alternatives.

Although the above has been described in terms of specific embodiments, variations, alternatives, and modifications can exist. As an example, the cleave region should be mechanically weak, to delaminate and/or rip the cleave region up mechanically. There should be some processing using an adhesive and/or to facilitate bonding between the porous region and/or support substrate member. In a specific embodiment, the glue layer can be spin on glass (liquid binder), metal, etc, and the like and stay away from direct bonding. In a specific embodiment, the glue layer can be partially absorbed into the porous layer. The glue layer can be sprayed, coated, painted, etc. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A composite structure comprising: a cleaved layer of photovoltaic material having a first layer and a second layer of porous semiconductor crystalline material, both layers comprised of a plurality of wormhole structures wherein density distribution of the wormhole structures in the first layer ranges from $10^{10}/cm^3$ to $10^{20}/cm^3$ and density distribution of the wormhole structures in the second layer ranges from $10/cm^3$ to $10^{10}/cm^3$, wherein the second layer is in between the first layer and a support, the cleaved layer comprised of a cleaved surface being textured with a surface roughness configured to capture photons illuminated thereon, the surface roughness being greater than about 100 nanometers to cause less than about 25% reflection from a total amount of illuminated photons in a wavelength ranging from about 0.1 micron to about 5 microns, the cleaved surface extending along the entire layer of photovoltaic material and the cleaved surface being configured and positioned to receive the photons by facing in a direction of the illuminating photons while the second layer of the cleaved layer faces in a direction away from an incident light source; one or more photovoltaic devices formed in the cleaved layer; the support comprising a glue layer overlying a surface of the second layer; and a permeable membrane structure selected from a mesh structure or a textile structure overlying the glue layer, the permeable membrane structure having a plurality of pores with a size ranging from about one micron to about one hundred microns and configured to facilitate outgassing of any volatile species in the glue layer to allow the glue layer to bind the permeable membrane structure to the surface of the second layer of the cleaved layer of photovoltaic material; a backplane overlying a backside of the permeable membrane structure.

2. The structure of claim 1 wherein the permeable membrane structure comprises a wire mesh.

3. The structure of claim 1 wherein the permeable membrane structure is flexible or rigid.

4. The structure of claim 1 wherein the glue layer comprises a spin on glass.

5. The structure of claim 1 wherein the glue layer is derived from a liquid phase material including a plurality of particles.

6. The structure of claim 1 wherein the permeable membrane structure comprises a fiberglass sheet.

7. The structure of claim 1 wherein the glue layer is derived from a mixture including a solvent.

8. The structure of claim 1 wherein the glue layer is derived from a liquid based material having gap filling properties.

9. The structure of claim 1 wherein the volatile species are selected from an organic species, an inorganic species, or water.

10. A method for fabricating a composite structure comprising: providing a semiconductor substrate comprised of photovoltaic material; forming a first layer and a second layer in the semiconductor substrate, both layers comprised of a plurality of wormhole structures wherein density distribution of the wormhole structures in the first layer ranges from $10^{10}/cm^3$ to $10^{20}/cm^3$ and density distribution of the wormhole structures in the second layer ranges from $10/cm^3$ to $10^{10}/cm^3$, wherein the first layer is in between the second layer and a remaining semiconductor substrate portion, the first layer defining a cleave region of the semiconductor substrate such that the semiconductor substrate is configured for a layer transfer process by removing the first and second layers from the remaining semiconductor substrate portion at the cleave region; forming a glue layer having a liquid base material overlying a surface region of the second layer, the liquid material being capable of outgassing one or more volatile species; coupling a permeable membrane structure selected from a mesh structure or a textile structure and having a plurality of pores with a size ranging from about one micron to about one hundred microns to the glue layer; and processing the permeable membrane structure coupled to the second layer to cause outgassing of a substantial portion of volatile species from the glue layer through the permeable membrane structure and curing the glue layer to form a substantially rigid solid structure to firmly engage the semiconductor substrate to the permeable membrane structure; and forming a cleaved layer by cleaving the formed first and second layers from the remaining portion of the semiconductor substrate to form a cleaved surface layer comprised of a continuous surface layer containing a plurality of wormhole structures on the surface of the permeable membrane structure, the cleaved surface layer having a surface roughness greater than about 100 nanometers to cause less than about 25% reflection from a total amount of illuminated photons in a wavelength ranging from about 0.1 microns to about 5 microns, the cleaved surface layer extending along an entire surface of the photovoltaic material and the cleaved surface layer being configured and positioned to receive the illuminated photons by facing in a direction of the photons; forming one or more photovoltaic devices in the cleaved layer such that the one or more photovoltaic devices face a direction of the photons; forming a backplane overlying a backside of the permeable membrane structure.

11. The method of claim 10 wherein the semiconductor substrate is single crystal silicon.

12. The method of claim 10 further comprising treating the first and second layers with a hydrogen plasma.

13. The method of claim 10 wherein the permeable membrane structure comprises a plastic structure.

14. The method of claim 10 wherein the permeable membrane structure comprises a fiberglass mesh.

15. The method of claim 10 the glue layer is derived from a mixture including a solvent.

16. The structure of claim 10 wherein the glue layer is derived from a liquid based material having gap filling properties.

17. The structure of claim 10 wherein the volatile species are selected from an organic species, an inorganic species, or water.

* * * * *